United States Patent [19]

Gröschl et al.

[11] Patent Number: 4,769,533
[45] Date of Patent: Sep. 6, 1988

[54] CIRCUIT ARRANGEMENT FOR A POSITION-SENSITIVE RADIATION DETECTOR

[75] Inventors: Martin Gröschl; Gerd Pfersmann, both of Wien, Austria

[73] Assignee: Leybold-Heraeus GmbH, Cologne, Fed. Rep. of Germany

[21] Appl. No.: 86,261

[22] Filed: Aug. 17, 1987

[30] Foreign Application Priority Data

Aug. 16, 1986 [DE] Fed. Rep. of Germany ....... 3627850

[51] Int. Cl.⁴ .............................................. H01J 40/14
[52] U.S. Cl. ..................................... 250/209; 250/210
[58] Field of Search ................ 250/201 AF, 206, 209, 250/208, 210; 356/1, 4

[56] References Cited

U.S. PATENT DOCUMENTS 3,028,500 4/1962 Wallmark ........................ 250/211 J
3,904,871 9/1975 Dueker et al. ...................... 250/209

Primary Examiner—David C. Nelms
Assistant Examiner—Jessica L. Ruoff
Attorney, Agent, or Firm—Felfe & Lynch

[57] ABSTRACT

The invention relates to a circuit arrangement for a position sensitive radiation detector which produces a current or voltage signal ($U_Y$) that depends exclusively on the coordinates x and y of the point of incidence of electromagnetic radiation on the EMR sensitive surface of a lateral diode (1). For this purpose, the circuit arrangement has integrators (4, 5), in which the voltages ($U_1$, $U_2$) are formed, which are proportional to the integral over time of the output currents ($I_1$, $I_2$) of the lateral diode (1). The difference between the voltages ($U_1$, $U_2$) is used as a signal, which depends exclusively on the coordinates at that particular time, at which the arithmetic mean of these voltages ($U_1$, $U_2$) has reached a preselected, constant value.

11 Claims, 1 Drawing Sheet

CIRCUIT ARRANGEMENT FOR A POSITION-SENSITIVE RADIATION DETECTOR

BACKGROUND OF THE INVENTION

The invention relates to a circuit arrangement for a position-sensitive radiation detector, which, when electromagnetic radiation is received, supplies two output currents $I_1$, $I_2$, the amplitude of which depends upon the coordinates of the point of incidence of the electromagnetic radiation. The circuit arrangement, to which the output currents $I_1$, $I_2$ are supplied, generates a signal that depends only on the particular coordinate and not on the intensity of the incident radiation. The circuit arrangement includes (1) a first device, to which an output current can be supplied and which generates a signal that is proportional to the product of the output current and time, and (2) a second device, to which an output current is supplied and which generates a signal that is proportional to the product of the output current and time.

In numerous fields of technology, it is necessary to know exactly the point of incidence of electromagnetic radiation (hereinafter "EMR"). For example, the point of incidence of an electron beam on the target of an electronic beam vaporizer source must be determined accurately, in order to be able to control it so that as uniform a surface temperature as possible is achieved over a particular area and, with that, a constant evaporation rate over this area. A strictly visual control is unsuitable for a fully automatic control system. Components are therefore used which respond to a particular radiation. These components react, for example, to the UV light or to the X-rays, which are formed when an electron beam strikes a target. In contrast to conventional photocells, light-dependent resistances or the like, which change their electric state as a function of the total amount of the incident radiation, and which are therefore not in a position to indicate space coordinates, the aforementioned components must have properties which make it possible to allocate space coordinates.

So-called lateral diodes, for example, are such components. These are position-sensitive semiconductor photodiodes of large surface, which utilize the lateral photoeffect. These photodiodes are also referred to as "PSD's" (position sensitive detectors). Provided that a suitable bias has been selected, unidirectional lateral diodes, a portion of the sensitive surface of which is struck by electromagnetic radiation, supply two output currents, the sum of which is proportional to the incident radiation and the difference between which is proportional to the intensity and proportional to the positional coordinates of the center of gravity of the incident radiation. The difference between the currents or a voltage proportional to this difference is referred to as a positional signal that has not been normalized. For many applications, however, the normalization of this signal, that is, the formation of a signal that is exclusively proportional to position, is required.

Various circuit arrangements have already been proposed to achieve such a normalization (see FIGS. 45 and 6 of the European Patent No. 85114404.8—Publication No. 0 184 680). These circuit arrangements are based on the fundamental concept that, by dividing the sum of the currents by the difference between the currents or the reverse, the influence of the intensity of the irradiation is eliminated and only the influence of the space coordinates is left in the current difference. This division is carried out by means of an analog divider, which divides a voltage that is proportional to the difference between the currents by a voltage that is proportional to the sum of the currents.

With such an arrangement, it is a disadvantage that the maximum permissible fluctuation range of the sum of the currents or of the intensity of the radiation striking the lateral diode is limited by the dynamics of the analog divider. Systems with high dynamics and operating according to the principle described above can be realized only by using expensive, precision components; otherwise, it is necessary to switch over the amplification factor of the preselectors. It is a further disadvantage of the known circuit arrangement that the achievable position resolution falls as the sum of the currents or the radiation intensity decreases.

Moreover, evaluation electronics for a differential photodiode sensor with the reciprocal transfer process of a capacitor and a pulse-width modulated output voltage are known, for which only one capacitor is used for two photodetectors for the reciprocal transfer process by a luminosity-proportional charging current of the photodiodes (German Patent Publication No. 3,531,378). For this system of evaluation electronics, the positional signal is obtained from the variable pulse-width repetition ratio of a pulse-width modulated square-wave voltage; that is, the positional signal is represented by the d.c. voltage fraction of this square-wave voltage, obtained by deep-pass filtration.

It is a disadvantage of this known system of evaluation electronics that the threshold frequency of the evaluation electronics is reduced by the low-pass filtration. Moreover, the total duration of an integration cycle depends upon the magnitude of the two charging currents. Therefore, when one of the input currents becomes very small, the total time for obtaining the data points is very long. The long integration cycle, as well as the reduction in the threshold frequency, make it apparent that the known system of evaluation electronics is not particularly suitable for recognizing points of incidence of EMR in rapid motion.

SUMMARY OF THE INVENTION

It is an objective of the present invention to provide a circuit arrangement which indicates the exact position of an EMR beam incident on a radiation-sensitive element even when the intensity of this beam fluctuates and when this beam is moving rapidly.

This objective as well as other objectives which will become apparent from the discussion that follows, are achieved, according to the present invention, in a circuit arrangement of the type described at the beginning of this specification, wherein:

(a) only the one output current is supplied to the first device and only the other output current is supplied to the second device;

(b) a third device is provided for the comparison of two signals, this device having a first input, to which a signal with specified value is applied, and a second input, to which a signal is applied that is composed of the signals, or parts thereof, coming from the first and second devices;

(c) a fourth device is provided, which has a first input, to which the output signal of the first device is supplied, and a second input, to which the output signal of the second device is supplied, and which forms the difference between the two output signals; and (d) a fifth device is provided, which stores the output signal of the fourth device at the time at which the two input signals of the third device are of equal magnitude.

The principal advantages achieved with the invention are that an analog divider may be omitted and that the position resolution is largely independent of the radiation intensity, since the measurement-relevant voltage difference of the output voltages at the outputs of the devices, to which the output signals of the radiation-sensitive elements are supplied, is independent of the radiation intensity. Moreover, the circuit arrangement of the invention has a high sensitivity or a low response threshold. Since the integration time is determined only by the sum of the two currents and is completely independent of their magnitude, this time is very short. As a result, the speed is increased. Furthermore, the inventive circuit arrangement does not require a switch for changing over from one integrating device to the other.

Preferred embodiments of the invention are shown in the drawing and described in greater detail in the following specification.

DETAILED DESCRIPTION OF THE PREFERRED EMBODIMENTS

Figure 1:
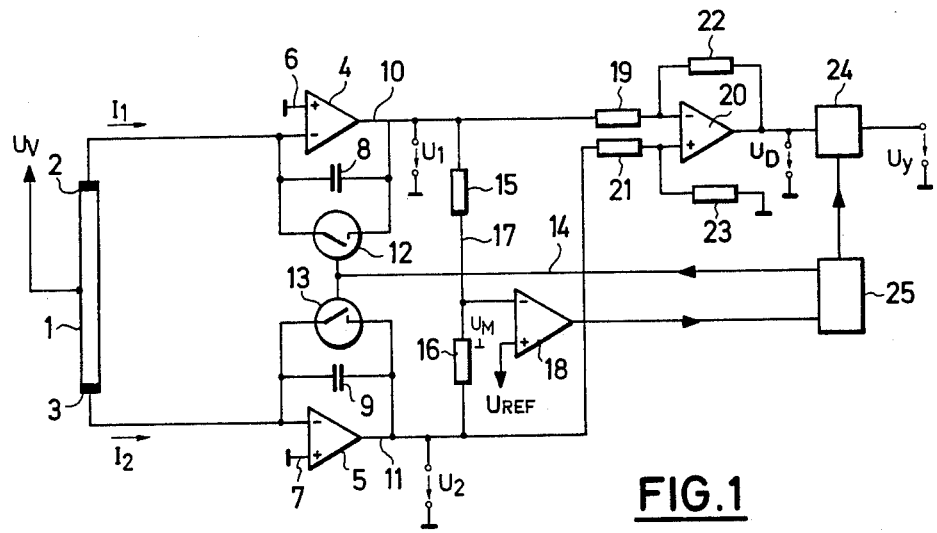
FIG. 1 shows a circuit arrangement for the display of a y coordinate, which can also be used for the display of an x coordinate; and, FIG. 2 shows a circuit arrangement with preamplifier for the display of a y coordinate, which can also be used for the display of the x coordinate.

In FIG. 1, a unidirectional lateral diode 1 is shown, which is provided with a bias voltage $U_y$ and has two terminals 2, 3. From these terminals 2, 3, conductors lead to the negative input of an operational amplifier 4, 5, the positive inputs 6, 7 of which are grounded. The current which flows from terminal 2 of the lateral diode 1 to the negative input of the operational amplifier 4 is labelled $I_1$, while the current which flows from terminal 3 of the lateral diode 1 to the negative input of the operational amplifier 5, is labelled $I_2$. The negative input of each of the two operational amplifiers 4, 5 is connected over a capacitor 8, 9 with the respective output 10, 11 of the corresponding operational amplifier 4 or 5, respectively. Parallel to the capacitor 8, 9, a controllable switch 12, 13 is provided, which can be triggered over a conductor 14. The outputs 10, 11 of the operational amplifiers 4, 5 are connected to one another over two resistors 15, 16 connected in series. From the connecting conductor 17 between the two resistors 15, 16, a further conductor leads to a first input of an operational amplifier 18. A reference voltage $U_{REF}$ is applied to a second input of this amplifier 18.

The output of the operational amplifier 4 is connected over a resistor 19 with the negative input of a further operational amplifier 20, while the output of the operational amplifier 5 is connected over a resistor 21 to the positive input of this amplifier 20. The output of the operational amplifier 20 is connected over a resistor 22 with the negative input of this amplifier 20, while the positive input of this amplifier 20 is grounded over a resistor 23. From the output of the operational amplifier 20, an additional conductor leads to the sample-and-hold circuit 24, that presents a voltage $U_y$ at the output. This sample-and-hold circuit 24 is triggered by a control device 25 which, in addition, receives signals from the operational amplifier 18 and delivers signals to the switch 12, 13. The operational amplifiers 4, 5 together with the capacitors 8, 9, form integrator stages, in which the currents $I_1$ and $I_1$, which are supplied by the unidirectional lateral diode 1, are integrated. Such integrator stages may be formed, for example, by operational amplifiers which are sold by Burr Brown under the designation OPA 356. The following equations are valid for the output voltages $U_1$ and $U_2$, respectively of the integrators:

$$U_1 = kI_1 t \tag{1}$$

$$U_2 = kI_2 t \tag{2}$$

In these equations, t is the integration time, while k is a proportionality factor. It follows from Equations (1) and (2) that $$U_1 - U_2 = kI_1 t - kI_2 t = kt(I_1 - I_2) \tag{3}$$

$$U_1 + U_2 = kI_1 t + kI_2 t = kt(I_1 + I_2) \tag{4}$$

The proportionality factor is assumed to be the same for the two integrators.

The operational amplifier 18 represents a comparator, which can be realized, for example, with an operational amplifier sold by Burr Brown under the designation OPA 37.

This comparator compares the reference voltage $U_{REF}$, which is applied at its one input, with the voltage $U_M$ at its other input. This last-mentioned voltage $U_M$ is the arithmetic mean of the output voltages $U_1$ and $U_2$ of the integrators 4, 8 and 5, 9 respectively. The following equation applies:

$$U_M = (U_1 + U_2)/2 \tag{5}$$

If the voltage $U_M$ reaches the value $U_{REF}$, the comparator 18 initiates the following cycle of operations:

The comparator 18 triggers the control unit 25, which in turn activates the sample-and-hold circuit 24, which takes over the value of the voltage $U_D$ at the output of the operational amplifier 20. This voltage $U_D$ is the difference between $U_1$ and $U_2$, because the operational amplifier 20 serves as a subtracting amplifier. A sample-and-hold circuit of the type described is sold, for example, by Burr Brown under the designation SHC 298. The integration capacitors 8 and 9 are then discharged by closing switches 12 and 13 respectively, as a result of which the output voltages $U_1$ and $U_2$ each assume the value of 0 volts. The switches 12 and 13 are sold, for example, as electronic switches by National Semiconductor Corp. under the designation CD 4066. By subsequently opening switches 12, 13, a new integration cycle is initiated.

In this connection, it is important that the measurement or storage of the instantaneous voltage difference $U_D$ is always carried out at that particular time at which the following equation applies for the sum of the voltages $U_1$ and $U_2$:

$$U_1 + U_2 = k' U_{REF} = constant \tag{6}$$

$U_{REF}$ denotes a constant, suitably selected voltage, while k' represents a proportionality factor. In the present example, it follows from Equations (5) and (6) that k' is 2 because $$(U_1+U_2)/2 = U_M$$

$$U_1+U_2 = k'U_{REF}$$

with $$U_M = U_{REF}$$

It follows from Equations (3), (4), (5) and (6) that, for the voltage $U_y$ applied at the output of the sample-and-hold circuit 24, $$U_y = k'U_{REF}(I_1-I_2)(I_1+I_2) \tag{8}$$

This follows from $U_y = U_1 - U_2 = (I_1 - I_2)kt$. From Equation (4)

$$k \times t = (U_1+U_2)(I_1+I_2)$$

Inserting this value for kt into the equation for $U_y$ $$U_y = (I_1-I_2)(U_1+U_2)(I_1+I_2)$$

However, since $U_1+U_2 = k'U_{REF}$, then $$U_y = k'U_{REF}(I_1-I_2)/(I_1+I_2)$$

It can be seen from Equation (8) that the voltage $U_y$ represents a quantity which depends only on the coordinates and no longer on the magnitude of the sum of the currents $I_1$ and $I_2$. In the present example, it is assigned to the y coordinate.

The selection of $U_{REF}$ depends on the magnitude of the capacitors 8 and 9. The following relationship applies:

$$t = k'C_{8,9}U_{REF}/(I_1+I_2)$$

in which $C_{8,9}$ refers to the capacitance of the capacitors 8, 9. Within technical limits, the magnitude of $U_{REF}$ does not affect the normalization of the position signal by the circuit arrangement.

Figure 2:
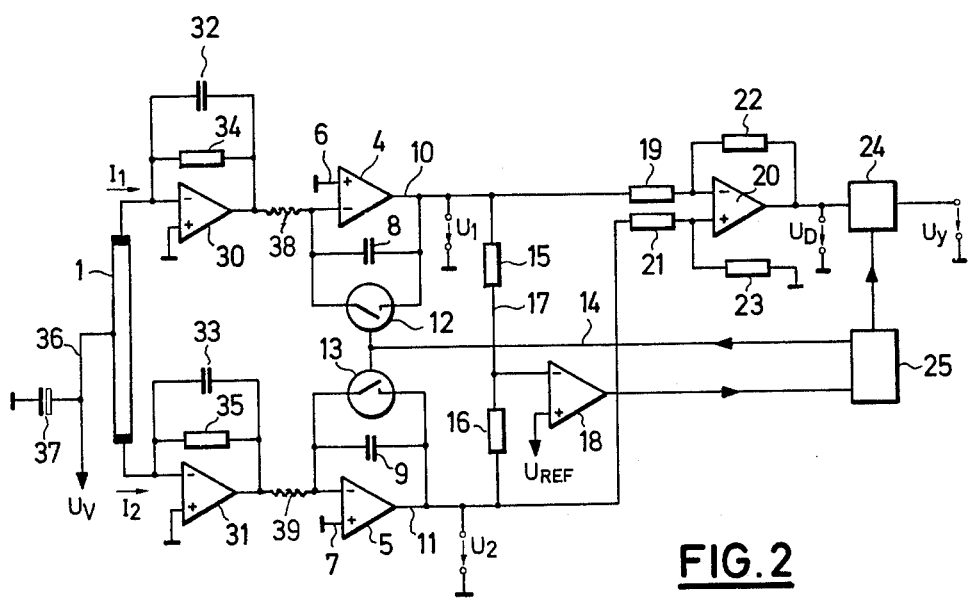

In FIG. 2, a circuit arrangement is shown, which largely corresponds to that of FIG. 1. In contrast to the latter, it has preamplifiers, comprising operational amplifiers 30, 31, ahead of the integrators 4, 8 or 5, 9. The feedback branch of the operational amplifiers 30, 31, is formed by a parallel circuit of a capacitor 32, 33 and a resistor 34, 35. These preamplifiers amplify the currents $I_1$, $I_2$, which come from the lateral diode 1. The conductor 36, to which the bias voltage $U_v$ is applied, is connected through a capacitor 37 to ground. Restistors 38 and 39 are provided between the inputs of the operational amplifiers 4 and 5 and the outputs of the amplifiers 30 and 31, respectively.

It goes without saying that the circuit arrangements of FIGS. 1 and 2, although they are shown only for displaying the y coordinate, can also be provided in a corresponding manner for displaying the x coordinate.

With two circuit arrangements like those of FIG. 1 and FIG. 2, the x, y positions of a beam within an x, y field can be determined if, for example, a arrangement such as that shown in FIG. 2 of the aforementioned European Patent Application No. 01 84 680 is selected.

There has thus been shown and described a novel circuit arrangement for a position-sensitive radiation detector which fulfills all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

We claim:

1. In a circuit arrangement for a position-sensitive radiation detector, which, when electromagnetic radiation is received, supplies two output currents $I_1$, $I_2$, the amplitude of which depends upon the coordinate of the point of incidence of the electromagnetic radiation, said circuit arrangement, to which the output currents $I_1$, $I_2$ are supplied, generating a signal, that depends only upon the particular coordinate and not on the intensity of the incident radiation, said circuit arrangement comprising (1) a first device, to which an output current can be supplied and which generates a signal that is proportional to the product of the output current and time, and (2) a second device, to which an output current is supplied and which generates a signal that is proportional to the product of the output current and time, the improvement wherein
    (a) only the one output current ($I_1$) is supplied to said first device and only the other output current ($I_2$) is supplied to said second device;
    (b) a third device is provided for the comparison of two signals, said third device having a first input, at which a signal with specified value ($U_{REF}$) is applied, and a second input, at which a second signal ($U_M$) is applied, said second signal being composed of the signals ($U_1$, $U_2$), or parts thereof, coming from said first and second devices;
    (c) a fourth device is provided, which has a first input to which the output signal ($U_1$) of said first device is supplied and a second input to which the output signal ($U_2$) of said second device is supplied, and which forms the difference between said two output signals ($U_2-U_1$); and
    (d) a fifth device is provided, which stores the output signal ($U_D$) of said fourth device at the time at which the two input signals ($U_M$, $U_{REF}$) of said third device are of equal magnitude.

2. The circuit arrangement of claim 1, wherein said first and second devices are integrators.

3. The circuit arrangement of claim 1, wherein said electronic component is a lateral diode.

4. The circuit arrangement of claim 1, wherein said electronic component is a differential diode sensor with two photodiodes.

5. The circuit arrangement of claim 2, wherein said integrators are operational amplifiers with feedback capacitors, and wherein said arrangement further comprises two switches, connected in parallel, for selectively shunting said capacitors.

6. The circuit arrangement of claim 5, wherein said switches are closed by a command from a sixth device, which is connected to the output of said third device.

7. The circuit arrangement of claim 6, wherein said sixth device is connected to and activates said fifth device when a signal appears at the output of said third device.

8. The circuit arrangement of claim 1, wherein said fifth device is a sample-and-hold circuit.

9. The circuit arrangement of claim 1, wherein said arrangement is provided in duplicate, one circuit arrangement determining the x coordinate and the other circuit arrangement determining the y coordinate.

10. The circuit arrangement of claim 1, wherein the proportionality factors k of said first and second devices are identical.

11. The circuit arrangement of claim 1, wherein the output currents ($I_1$, $I_2$), which the radiation detector supplies when struck by electromagnetic radiation in the axis direction, in which the position sensitivity of the detector is placed, depend with respect to their amplitudes on the coordinates of the point of incidence of the electromagnetic radiation in the respective direction.

* * * * *